US008879044B2

(12) United States Patent
Auer

(10) Patent No.: US 8,879,044 B2
(45) Date of Patent: Nov. 4, 2014

(54) LITHOGRAPHIC APPARATUS, AND MOTOR COOLING DEVICE

(75) Inventor: Frank Auer, Valkenswaard (NL)

(73) Assignee: ASML Netherlands B.V., Veldhoven (NL)

(*) Notice: Subject to any disclaimer, the term of this patent is extended or adjusted under 35 U.S.C. 154(b) by 775 days.

(21) Appl. No.: 13/050,344

(22) Filed: Mar. 17, 2011

(65) Prior Publication Data

US 2011/0194085 A1 Aug. 11, 2011

Related U.S. Application Data

(62) Division of application No. 11/511,532, filed on Aug. 29, 2006, now Pat. No. 7,916,267.

(51) Int. Cl.
G03B 21/16 (2006.01)
H02K 5/20 (2006.01)
G03F 7/20 (2006.01)

(52) U.S. Cl.
CPC *G03B 21/16* (2013.01); *H02K 5/20* (2013.01); *G03F 7/70758* (2013.01); *G03F 7/70858* (2013.01)
USPC .............. 355/30; 310/53; 310/12.05; 355/72; 355/75

(58) Field of Classification Search
CPC ... G03F 7/70858; G03F 7/70758; H02K 9/00; H02K 9/005; H02K 9/08; H02K 9/10; H02K 9/16; H02K 9/193; H02K 9/197; H02K 1/20; H02K 1/34; H02K 3/24; H02K 5/20
See application file for complete search history.

(56) References Cited

U.S. PATENT DOCUMENTS

| 4,865,123 | A | 9/1989 | Kawashima et al. |
| 4,916,340 | A | 4/1990 | Negishi |
| 5,063,582 | A | 11/1991 | Mori et al. |
| 5,138,206 | A | 8/1992 | Schmidt |
| 5,577,552 | A | 11/1996 | Ebinuma et al. |

(Continued)

FOREIGN PATENT DOCUMENTS

| JP | 6-153381 A | 5/1994 |
| JP | 11-307430 A | 11/1999 |

(Continued)

OTHER PUBLICATIONS

Notice of Reasons for Rejection mailed Sep. 2, 2010 for Japanese Patent Application No. 2007-215558; 3 pages.

(Continued)

*Primary Examiner* — Steven H Whitesell Gordon
(74) *Attorney, Agent, or Firm* — Sterne, Kessler, Goldstein & Fox P.L.L.C.

(57) ABSTRACT

A lithographic device includes a cooling device for removing heat from a motor. The cooling device has a cooling element provided in thermal contact with at least part of the motor. The cooling device further has a cooling duct assembly with a supply duct to supply a cooling fluid to the cooling element, and a discharge duct to discharge the cooling fluid from the cooling element. A pump causes the cooling fluid to flow through at least part of the cooling duct assembly. A flow control device controls a flow rate of the cooling fluid through at least part of the cooling duct assembly, to maintain a predetermined average temperature of the cooling fluid in the cooling element.

8 Claims, 4 Drawing Sheets

(56) References Cited

U.S. PATENT DOCUMENTS

Figure 1:
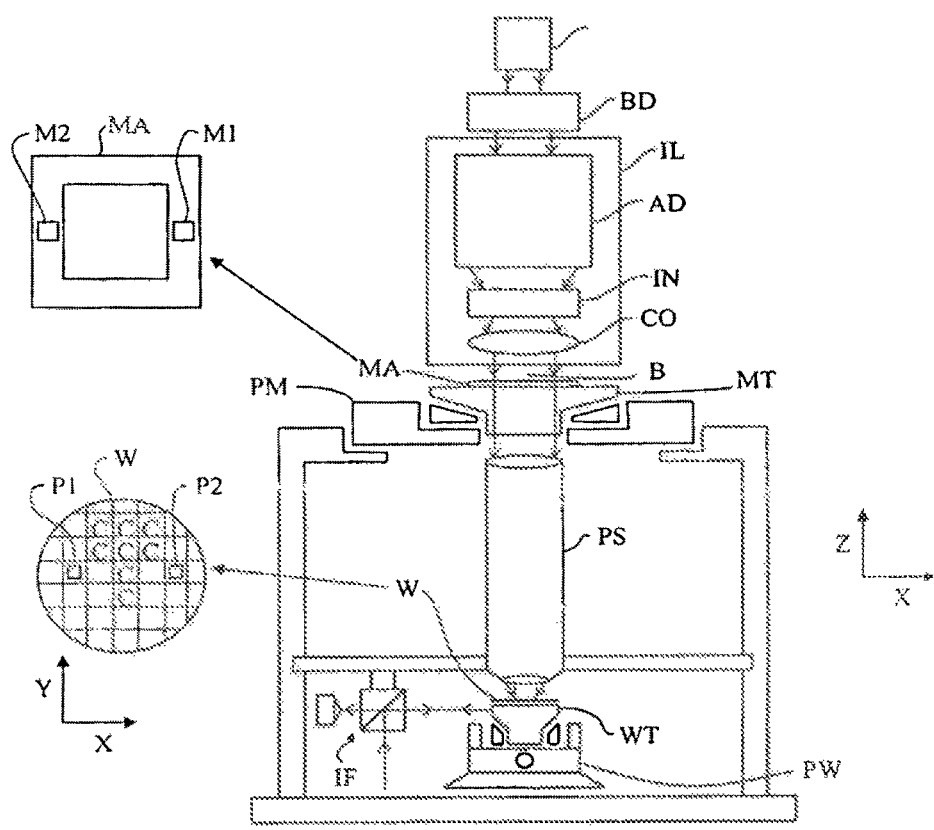

| | | | |
|---|---|---|---|
| 5,770,899 A | 6/1998 | Hayashi | |
| 5,959,732 A | 9/1999 | Hara et al. | |
| 5,998,889 A | 12/1999 | Novak | |
| 6,008,553 A | 12/1999 | Gonzalez | |
| 6,226,073 B1 | 5/2001 | Emoto | |
| 6,469,406 B1 | 10/2002 | Hwang et al. | |
| 6,762,516 B2 | 7/2004 | Maruyama | |
| 6,806,594 B2 | 10/2004 | Koyanagawa et al. | |
| 6,810,298 B2 | 10/2004 | Emoto | |
| 7,116,396 B2 | 10/2006 | Tsuji et al. | |
| 2005/0057102 A1 | 3/2005 | Totsu et al. | |
| 2005/0140959 A1* | 6/2005 | Tsuji et al. | 355/72 |
| 2006/0007415 A1 | 1/2006 | Kosugi et al. | |
| 2006/0119815 A1* | 6/2006 | Franken et al. | 355/53 |
| 2007/0089853 A1* | 4/2007 | Nomoto | 165/65 |

FOREIGN PATENT DOCUMENTS

| | | |
|---|---|---|
| JP | 2000-252194 A | 9/2000 |
| JP | 2005-303042 A | 10/2005 |
| WO | WO 03-079418 A1 | 9/2003 |

OTHER PUBLICATIONS

U.S. Non Final Office Action directed to related U.S. Appl. No. 11/511,532, filed Aug. 29, 2006, mailed Apr. 28, 2009; 11 pages.

U.S. Final Office Action directed to related U.S. Appl. No. 11/511,532, filed Aug. 29, 2006, mailed Nov. 23, 2009; 11 pages.

U.S. Notice of Allowance directed to related U.S. Appl. No. 11/511,532, filed Aug. 29, 2006, mailed Nov. 22, 2010; 6 pages.

* cited by examiner

US 8,879,044 B2

LITHOGRAPHIC APPARATUS, AND MOTOR COOLING DEVICE

CROSS REFERENCE TO RELATED APPLICATIONS

This application is a Divisional of U.S. patent application Ser. No. 11/511,532; filed Aug. 29, 2006 (that issued as U.S. Pat. No. 7,916,267 on Mar. 29, 2011), which is incorporated by reference herein in its entirety.

BACKGROUND

1. Field of the Invention

The present invention relates to a lithographic apparatus including a motor cooling device, and a cooling device for removing heat from a motor.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Patterning devices as well as substrates may be moved during the transfer of the pattern onto the substrate. For this purpose, patterning devices and substrates are mounted to associated supports called patterning support and substrate support, respectively, which are driven by motors in several degrees of freedom. Movements of supports are to be made in the shortest times possible. Therefore, motors for a substrate support, in particular, but not limited thereto, tend to require an increasing amount of power to allow increasing accelerations and decelerations, where also the mass to be accelerated and to be decelerated has a tendency to increase. At the same time, there is a need to keep the physical dimensions of the motors limited.

In operation, a motor dissipates heat. In an electric motor, heat is generated by a current flowing in an electrical coil accommodated in a part of the motor. The heat dissipated in a motor is to be removed through at least one cooling element, such as a cooling plate, mounted in a thermal contact with the heat generating part of the motor. In a cooling element, heat generated in a motor is transferred to a cooling fluid (a gas or a liquid, e.g. water). The cooling fluid is fed to the cooling element through a supply duct, flows into and through the cooling element, e.g. in channels provided in the cooling element, and out of the cooling element into a discharge duct, whereby heat is removed from the heat generating part of the motor. A portion of this heat is transferred from the cooling element to an environment of the motor, or vice versa, by radiation and convection, where the amount of heat transferred is determined by an average temperature of a surface of the cooling element. It is desirable to limit the heat transferred between the cooling element surface and the environment to maintain stable operating conditions of the apparatus containing the motor, even if the heat dissipated in the motor varies when the load of the motor varies.

Conventionally, a motor has been cooled by feeding a cooling fluid having a fixed temperature to the motor's cooling element with a fixed flow rate. Since the dissipated heat in the motor varies in time while the amount of water per unit of time does not vary, the average temperature of the surface of the cooling element will vary with the load of the motor. Since the average temperature and variations in this average temperature are to be limited, also the load of the motor (the heat dissipated in the motor) is limited.

With the increased power of motors, and the size limitations of the motors at the same time, problems arise in the cooling of the motors.

Increasing a cooling rate of a cooling fluid by increasing a cross-section of a cooling channel in a cooling element is undesirable since this will increase a magnetic gap in the motor, thereby deteriorating the motor constant.

Increasing a flow rate of a cooling fluid by increasing a flow speed of the cooling fluid in a cooling element is undesirable in view of the high pressure needed, and in view of the risk of the cooling fluid flow becoming turbulent instead of laminar, thus creating unwanted vibrations and an excessive pressure drop. A high pressure would further necessitate a construction capable of withstanding such pressure. Also, a high pressure or flow speed could give rise to an undesired generation of vibrations.

Decreasing a cooling fluid temperature, and allowing a higher temperature rise of the cooling fluid is undesirable in view of the resulting relatively high temperature fluctuations when the motor load varies over a broad range.

SUMMARY

It is desirable to provide a motor cooling arrangement suitable for a motor operating under high loads, and thus dissipating a high amount of heat.

In an embodiment according to the invention, there is provided a lithographic apparatus including: an illumination system configured to condition a radiation beam; a patterning support constructed to support a patterning device, the patterning device being capable of imparting the radiation beam with a pattern in its cross-section to form a patterned radiation beam; a substrate support constructed to support a substrate; a projection system configured to project the patterned radiation beam onto a target portion of the substrate; a motor coupled to one of the patterning support and the substrate support; and a cooling device configured to remove heat from the motor. The cooling device includes: a cooling element provided in thermal contact with at least part of the motor; a cooling duct assembly including a supply duct for supplying a cooling fluid to the cooling element, and a discharge duct for discharging the cooling fluid from the cooling element; a pump configured to cause the cooling fluid to flow through at least part of the cooling duct assembly; and a flow control device configured to control a flow rate of the cooling fluid through at least part of the cooling duct assembly, to reach a predetermined average temperature of the cooling fluid in the cooling element.

In an embodiment according to the invention, the cooling fluid in the supply duct has a predetermined supply temperature, the flow control device including a temperature sensor measuring a discharge temperature of the cooling fluid in the discharge duct, and the flow control device being configured to compare the discharge temperature to a reference temperature for controlling the flow rate of the cooling fluid.

In an embodiment according to the invention, the flow control device includes a first temperature sensor measuring a supply temperature of the cooling fluid in the supply duct, and a second temperature sensor measuring a discharge temperature of the cooling fluid in the discharge duct, and the flow control device being configured to compare an average temperature of the supply temperature and the discharge temperature to a reference temperature for controlling the flow rate of the cooling fluid.

In an embodiment according to the invention, the flow control device includes a temperature sensor measuring a motor temperature of at least part of the motor, and the flow control device being configured to compare the motor temperature to a reference temperature for controlling the flow rate of the cooling fluid.

In an embodiment according to the invention, the motor is an electric motor to be energized by at least one motor current, the flow control device being configured to measure the at least one motor current to control a flow rate of the cooling fluid.

In a further embodiment according to the invention, there is provided a cooling device for removing heat from a motor. The cooling device includes: a cooling element provided in thermal contact with at least part of the motor; a cooling duct assembly including a supply duct for supplying a cooling fluid to the cooling element, and a discharge duct for discharging the cooling fluid from the cooling element; a pump configured to cause the cooling fluid to flow through at least part of the cooling duct assembly; and a flow control device configured to control a flow rate of the cooling fluid through at least part of the cooling duct assembly, to maintain a predetermined average temperature of the cooling fluid in the cooling element.

A device manufacturing method includes (a) patterning a beam of radiation with a patterning device to form a patterned beam of radiation, the patterning device supported by a patterning device support; (b) projecting the patterned onto a substrate, the substrate supported by a substrate support; (c) positioning one of the supports with a motor; and (d) removing heat generated by the motor with a cooling element in thermal contact with at least part of the motor, the removing including (i) supplying a cooling fluid to the cooling element; (ii) discharging the cooling fluid from the cooling element; and (iii) controlling a flow rate of the cooling fluid through the cooling element to maintain a predetermined average temperature of the cooling fluid in the cooling element.

BRIEF DESCRIPTION OF THE DRAWINGS/FIGURES

Figure 2:
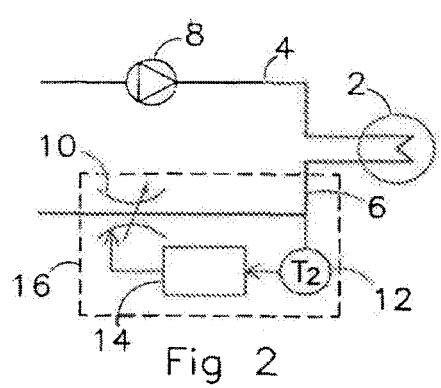
Figure 3:
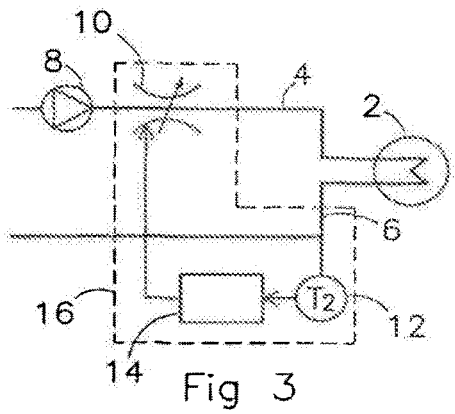
Figure 4:
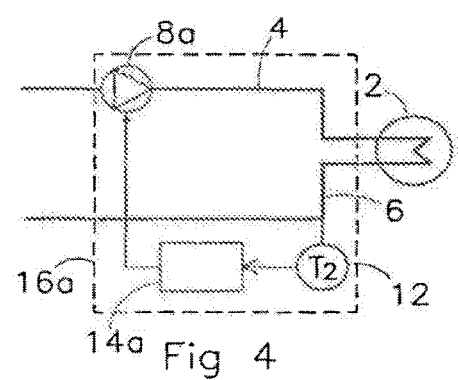
Figure 5:
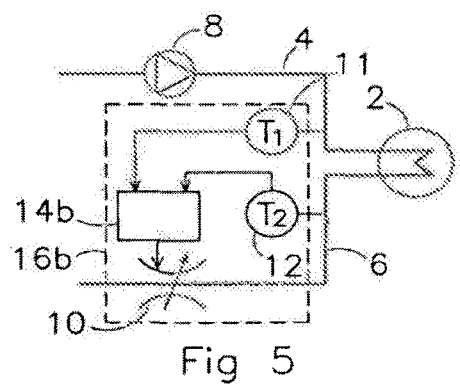
Figure 6:
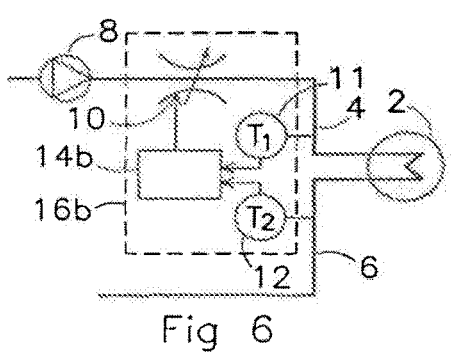
Figure 7:
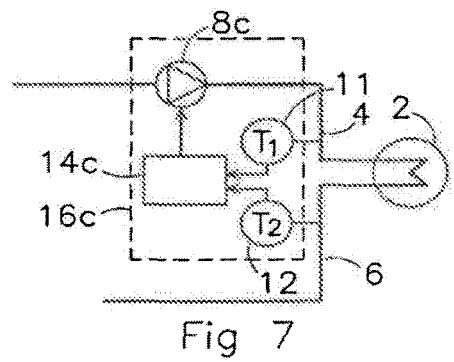
Figure 8:
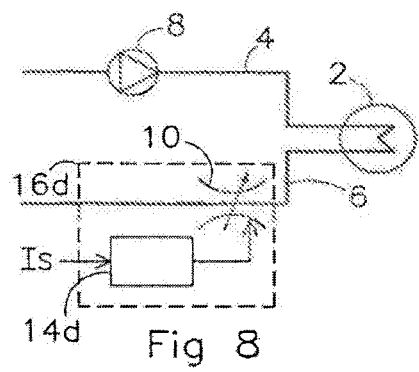
Figure 9:
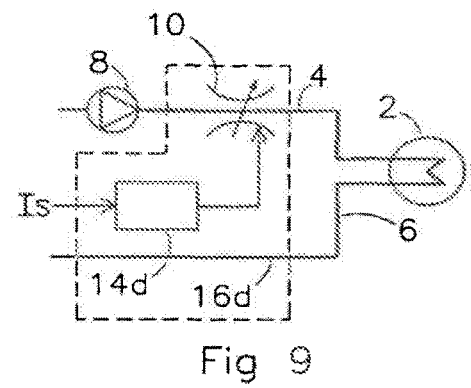
Figure 10:
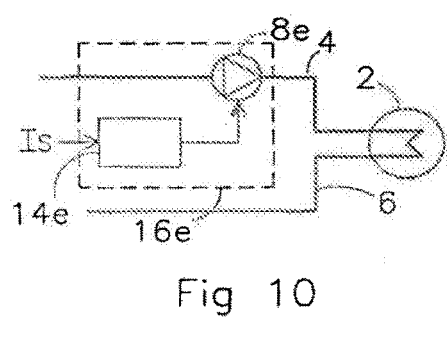
Figure 11:
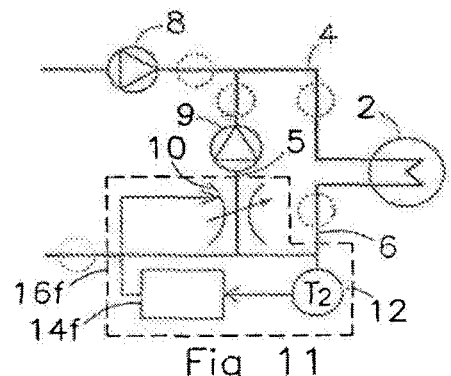
Figure 12:
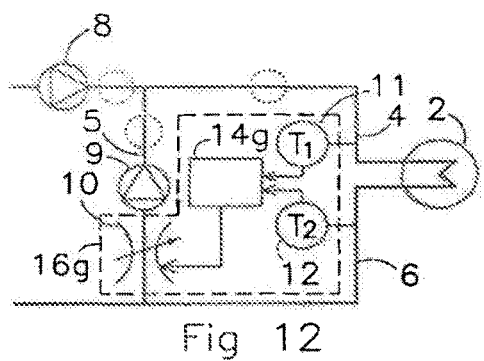
Figure 13:
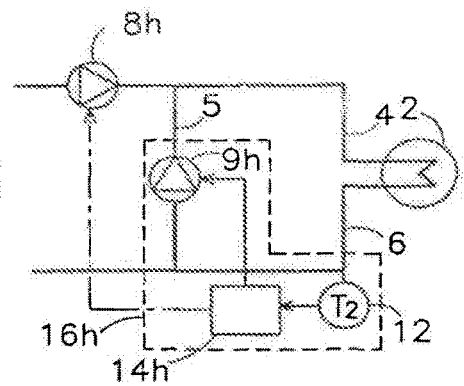
Figure 14:
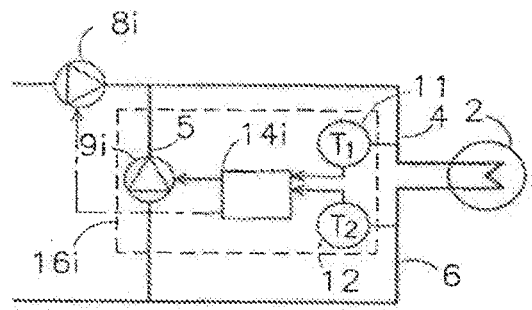
Figure 15:
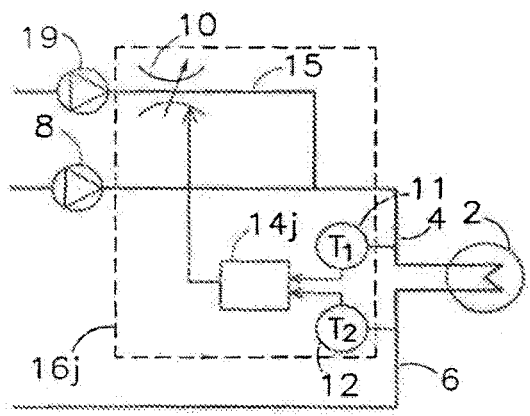
Figure 16:
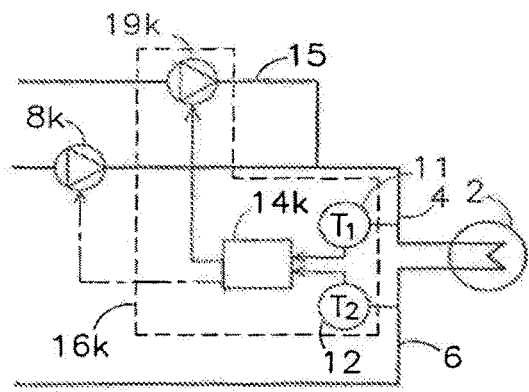

Embodiments of the invention will now be described, by way of example only, with reference to the accompanying schematic drawings in which corresponding reference symbols indicate corresponding parts, and in which:

FIG. 1 depicts a lithographic apparatus according to an embodiment of the invention;

FIG. 2 schematically shows a motor cooling device in an embodiment of the invention;

FIG. 3 schematically shows a motor cooling device in a further embodiment of the invention;

FIG. 4 schematically shows a motor cooling device in a further embodiment of the invention;

FIG. 5 schematically shows a motor cooling device in a further embodiment of the invention;

FIG. 6 schematically shows a motor cooling device in a further embodiment of the invention;

FIG. 7 schematically shows a motor cooling device in a further embodiment of the invention;

FIG. 8 schematically shows a motor cooling device in a further embodiment of the invention;

FIG. 9 schematically shows a motor cooling device in a further embodiment of the invention;

FIG. 10 schematically shows a motor cooling device in a further embodiment of the invention;

FIG. 11 schematically shows a motor cooling device in a further embodiment of the invention;

FIG. 12 schematically shows a motor cooling device in a further embodiment of the invention;

FIG. 13 schematically shows a motor cooling device in a further embodiment of the invention;

FIG. 14 schematically shows a motor cooling device in a further embodiment of the invention;

FIG. 15 schematically shows a motor cooling device in a further embodiment of the invention; and FIG. 16 schematically shows a motor cooling device in a further embodiment of the invention.

DETAILED DESCRIPTION

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as .sigma.-outer and .sigma.-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioning device PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The first positioning device PM and/or the second positioning device PW include several motors. According to an embodiment of the present invention, at least some of these motors may be provided with a cooling device to be described in more detail below.

FIG. 2 shows a cooling element 2 to be provided in thermal contact with at least part of a motor, such as an electric motor. Conventionally, in an electric motor heat is dissipated at least in motor coils. In a planar motor, such coils may essentially extend in a plane, and the coils may be sandwiched between cooling elements designed as cooling plates.

A cooling duct assembly includes a supply duct 4 through which a cooling fluid (i.e. a gas or a liquid, such as water) is fed to the cooling element 2, and further includes a discharge duct 6 through which the cooling fluid is discharged from the cooling element 2. A pump 8 provides a flow of the cooling fluid in the cooling duct assembly.

The cooling arrangement shown in FIG. 2 further includes a controllable valve 10 in the discharge duct 6, and a temperature sensor 12 configured to measure a discharge temperature of the cooling fluid in the discharge duct 6. A signal representative of the discharge temperature is input to a control system 14 outputting a control signal to control the flow rate of the valve 10. The assembly of the temperature sensor 12, the control system 14, and the valve 10 may be considered to be a flow control device 16.

The operation of the cooling device in FIG. 2 is as follows. The pump 8 delivers a flow of cooling fluid having a predetermined temperature T1 into the supply duct 4, through the cooling element 2, where heat dissipated by a motor or part thereof is taken up by the cooling fluid, and further through the discharge duct 6 and the valve 10. From the discharge duct 6, the cooling fluid may be discharged, not to be used again, or may be cooled to the predetermined temperature T1 and fed to the pump 8 again for recirculation.

The flow rate of the cooling fluid in the cooling duct assembly is determined by the flow control device 16. A temperature T2 measured by the temperature sensor 12 is input to the control system 14 that compares this temperature with the predetermined (known) temperature T1 (which may also be referred to as a reference temperature) of the cooling fluid in the supply duct 4. The control system 14 is configured to control the flow rate of the cooling fluid by the valve 10 such that a predetermined average temperature Ta=(T2+T1)/2 of the cooling fluid in the cooling element 2 is reached.

As an example, T1 is 12° C. and Ta is chosen to be 22° C. The flow control device 16 controls the flow rate of the cooling fluid by the valve 10 such that according to the relationship above T2 becomes 2·Ta−T1=32° C. The higher the heat load on the cooling element 2, the higher the flow rate of the cooling fluid in the cooling duct assembly should be in order to reach the desired average temperature Ta in the cooling element 2. Inversely, the lower the heat load on the cooling element 2 is, the lower the flow rate of the cooling fluid in the cooling duct assembly should be in order to reach the desired average temperature Ta in the cooling element 2. If the heat load on the cooling element 2 is zero, then the valve 10 may close the discharge duct 6, thereby stopping a flow of cooling fluid in the duct assembly.

In the embodiment of FIG. 3, the valve 10 is placed in the supply duct 4 instead of in the discharge duct 6 as in FIG. 2. However, the operation of the flow control device 16 in FIG. 3 is the same as the operation of the flow control device 16 in FIG. 2. A difference between the embodiments of FIG. 2 and FIG. 3 may be seen in that according to FIG. 2 the cooling fluid pressure in the cooling element 2 does not vary with variations of the flow rate of the cooling fluid caused by the control of the valve 10 by the control system 14, whereas according to FIG. 3 the cooling fluid pressure in the cooling element 2 varies with variations of the flow rate of the cooling fluid caused by the control of the valve 10 by the control system 14.

In the embodiment of FIG. 4, a flow control device 16a includes a temperature sensor 12, a control system 14a and a pump 8a having a controllable flow rate. A signal representative of the temperature T2 measured by the temperature sensor 12 is input to the control system 14a that compares this temperature with a predetermined (thus: known) temperature T1 of the cooling fluid in the supply duct 4. The control system 14 is configured to control the flow rate of the cooling fluid by controlling the flow rate of the pump 8a such that a predetermined average temperature Ta=(T2+T1)/2 of the cooling fluid in the cooling element 2 is reached.

In an embodiment shown in FIG. 5, a flow control device 16b includes a temperature sensor 11 measuring a temperature T1 of the cooling fluid in the supply duct 4, a temperature sensor 12 measuring a temperature T2 of the cooling fluid in the discharge duct 6, a control system 14b, and a controllable valve 10 in the discharge duct 6.

Like in the previous embodiments, a flow rate of the cooling fluid in the cooling duct assembly is determined by the flow control device 16b. Signals representative of the temperatures T1 and T2 measured by the temperature sensors 11 and 12, respectively, are input to the control system 14b that compares these temperatures. The control system 14b is configured to control the flow rate of the cooling fluid by the valve 10 such that a predetermined average temperature Ta=(T2+T1)/2 of the cooling fluid in the cooling element 2 is reached. Unlike the embodiment of FIG. 2, in the embodiment of FIG. 5 a temperature T1 of the cooling fluid in the supply duct 4 does not need to be known or set accurately, as long as it is lower than the average temperature Ta to be reached.

As an example, when T1 is 10° C. and Ta is chosen to be 22° C., the flow control device 16b controls the flow rate of the cooling fluid such that according to the relationship above T2 becomes 2Ta−T1=34° C. When T1 is 15° C. and Ta is again chosen to be 22° C., the flow control device 16b controls the flow rate of the cooling fluid such that according to the relationship above T2 becomes 2Ta−T1=29° C. Accordingly, the higher T1, the lower T2 should become to obtain the same average temperature Ta.

In an embodiment shown in FIG. 6, the valve 10 is placed in the supply duct 4 instead of in the discharge duct 6 as in FIG. 5. However, the operation of the flow control device 16b in FIG. 6 is the same as the operation of the flow control device 16b in FIG. 5. A difference between the embodiments of FIG. 5 and FIG. 6 may be seen in that according to FIG. 5 the cooling fluid pressure in the cooling element 2 does not vary with variations of the flow rate of the cooling fluid caused by the control of the valve 10 by the control system 14b, whereas according to FIG. 6 the cooling fluid pressure in the cooling element 2 varies with variations of the flow rate of the cooling fluid caused by the control of the valve 10 by the control system 14b.

In an embodiment shown in FIG. 7, a flow control device 16c includes a temperature sensor 11, a temperature sensor 12, a control system 14c and a pump 8c having a controllable flow rate. Signals representative of temperatures T1 and T2 measured by the temperature sensors 11 and 12, respectively, are input to the control system 14c that compares these temperatures. The control system 14 is configured to control the flow rate of the cooling fluid by controlling the flow rate of the pump 8c such that a predetermined average temperature Ta=(T2+T1)/2 of the cooling fluid in the cooling element 2 is reached.

FIG. 8 shows an embodiment of a cooling device including a supply duct 4 with a pump 8, a cooling element 2, and a discharge duct 6 with a controllable valve 10. The valve 10 is part of a flow control device 16d further including a control system 14d.

In operation, the flow rate of the cooling fluid in the cooling duct assembly of FIG. 8 is determined by the flow control device 16d. A current Is in a motor that is in thermal contact with the cooling element 2 is measured, and is representative of the heat load on the cooling element 2. A signal representative of the current Is is input to the control system 14d, which in turn outputs a control signal to control the flow rate of the valve 10. The control system 14d is configured to control the flow rate of the cooling fluid by the valve 10 such that a predetermined average temperature Ta of the cooling fluid in the cooling element 2 is reached. Like in the embodiments of FIGS. 2, 3, and 4, it is presumed that the temperature of the cooling fluid in the supply duct 4 is known. A relationship between a current Is and a corresponding flow rate of the valve 10 for varying currents Is may have been pre-established through a calibration of the flow control device 16d, for reaching the desired average temperature Ta of the cooling fluid in the cooling element 2.

In the embodiment of FIG. 9, the valve 10 is placed in the supply duct 4 instead of in the discharge duct 6 as in FIG. 8. However, the operation of the flow control device 16d in FIG. 9 is the same as the operation of the flow control device 16d in FIG. 8. A difference between the embodiments of FIGS. 8 and 9 may be seen in that according to FIG. 8 the cooling fluid pressure in the cooling element 2 does not vary with variations of the flow rate of the cooling fluid caused by the control of the valve 10 by the control system 14d, whereas according to FIG. 9 the cooling fluid pressure in the cooling element 2 varies with variations of the flow rate of the cooling fluid caused by the control of the valve 10 by the control system 14d.

In the embodiment of FIG. 10, a flow control device 16e includes a control system 14e and a pump 8e having a controllable flow rate. Similar to FIGS. 8 and 9, a signal representative of a motor current Is is input to the control system 14e that is configured to control the flow rate of the cooling fluid by controlling the flow rate of the pump 8e such that a predetermined average temperature Ta of the cooling fluid in the cooling element 2 is reached. A relationship between a current Is and a corresponding flow rate of the pump 8e for varying currents Is may have been pre-established through a calibration of the flow control device 16e, for reaching the desired average temperature Ta of the cooling fluid in the cooling element 2.

FIG. 11 shows a cooling element 2 to be provided in thermal contact with at least part of a motor. A cooling duct assembly includes a supply duct 4 through which a cooling fluid (i.e. a gas or a liquid, such as water) is fed to the cooling element 2, and further includes a discharge duct 6 through which the cooling fluid is discharged from the cooling element 2. A pump 8 provides a flow of the cooling fluid in the cooling duct assembly.

The cooling device shown in FIG. 11 further includes a recirculation duct 5 having an additional pump 9, a controllable valve 10 in the recirculation duct 5, and a temperature sensor 12 to measure a discharge temperature of the cooling fluid in the discharge duct 6. The recirculation duct 5 connects the supply duct 4 with the discharge duct 6. A signal representative of the discharge temperature is input to a control system 14f outputting a control signal to control the flow rate of the valve 10. The assembly of the interconnected temperature sensor 12, the control system 14f, and the valve 10 may be considered to be a flow control device 16f.

The operation of the cooling arrangement in FIG. 11 is as follows. The pump 8 delivers a flow of cooling fluid having a predetermined temperature T1 into the supply duct 4, through the cooling element 2, where heat dissipated by a motor is taken up by the cooling fluid, and further through the discharge duct 6. From the discharge duct 6, a part of the cooling fluid is recirculated through the recirculation duct 5 including, the valve 10 and the pump 9 to the supply duct 4.

The flow rate of the cooling fluid in the cooling duct assembly is determined by the flow control device 16f. A temperature T2 measured by the temperature sensor 12 is input to the control system 14f that is configured (e.g. by calibration) to control the flow rate of the cooling fluid by the valve 10 such that a predetermined average temperature Ta of the cooling fluid in the cooling element 2 is reached.

It is observed here, that the valve 10 may be placed in the recirculation duct 5 downstream of the pump 9, instead of in the recirculation duct 5 upstream of the pump 9 as shown in FIG. 11, or may be placed in the supply duct 4, upstream or downstream of the recirculation duct 5, or in the discharge duct 6, upstream or downstream of the recirculation duct 5. The alternative places are indicated by dashed circles. Also, more than one valve 10 may be mounted at any of the indicated places, and may be controlled separately or commonly.

An embodiment of a cooling device shown in FIG. 12 differs from the cooling device of FIG. 11 in that the cooling device of FIG. 12 includes a temperature sensor 11 measuring a temperature T1 of the cooling fluid in the supply duct 4 downstream of the recirculation duct 5, and a temperature sensor measuring a temperature T2 of the cooling fluid in the discharge duct 6 upstream of the recirculation duct 5.

In the embodiment of FIG. 12, a flow control device 16g includes the interconnected temperature sensors 1 and 12, a control system 14g, and a controllable valve 10 in the recirculation duct 5.

Like in the previous embodiments, the flow rate of the cooling fluid in the cooling duct assembly is determined by the flow control device 16g. Signals representative of the temperatures T1 and T2 measured by the temperature sensors 11 and 12, respectively, are input to the control system 14g that compares these temperatures. The control system 14g is configured to control the flow rate of the cooling fluid by the valve 10 such that a predetermined average temperature Ta=(T2+T1)/2 of the cooling fluid in the cooling element 2 is reached. Unlike the embodiment of FIG. 11, in the embodiment of FIG. 12 a temperature of the cooling fluid in the supply duct 4, whether upstream or downstream the recirculation duct 5, does not need to be known or set accurately, as long as it is lower than the average temperature Ta to be reached.

Like in the embodiment of FIG. 11, in the embodiment of FIG. 12 the valve 10 may be placed in the recirculation duct 5 downstream of the pump 9, instead of in the recirculation duct 5 upstream of the pump 9, or may be placed in the supply duct 4, upstream or downstream of the recirculation duct 5, or in the discharge duct 6, upstream or downstream of the recirculation duct 5. The alternative places are indicated by dashed circles. Also, more than one valve 10 may be mounted at any of the indicated places, and may be controlled separately or commonly.

In relation to each of the FIGS. 11 and 12, an alternative embodiment may be designed wherein the pump 9 is absent, while all other components, in particular the valve 10, remain present. The duct 5 now may be referred to as a bypass duct, including the valve 10. In the alternative embodiment, the pump 8 delivers a flow of cooling fluid having a predetermined temperature T1 into the supply duct 4 and the bypass duct 5. The flow rate of the cooling fluid in the bypass duct 5 is determined by the flow control device 16f (FIG. 11), 16g (FIG. 12). In turn, the flow rate of the cooling fluid in the supply duct 4 is determined by the flow rate of the cooling fluid in the bypass duct 5. The flow provided by the pump 8 is constant. According to FIG. 11, in the alternative embodiment the temperature T2 measured by the temperature sensor 12 is input to the control system 14f that is configured to control the flow rate of the cooling fluid by the valve 10 such that a predetermined average temperature Ta of the cooling fluid in the cooling element 2 is reached. According to FIG. 12, in the alternative embodiment the signals representative of the temperatures T1 and T2 measured by the temperature sensors 11 and 12, respectively, are input to the control system 14g that compares these temperatures, and is configured to control the flow rate of the cooling fluid by the valve 10 such that a predetermined average temperature Ta=(T2+T1)/2 of the cooling fluid in the cooling element 2 is reached. Alternative places of the valve 10 indicated by dashed circles are not applicable in the alternative embodiment.

FIG. 13 shows a flow control device 16h including a temperature sensor 12 inputting a signal representative of a temperature of the cooling fluid in the discharge duct 6 to a control system 14h, which outputs a control signal to a pump 9h having a controllable flow rate in a recirculation duct 5 connecting the discharge duct 6 to the supply duct 4. Alternatively, or additionally, the control system 14h may output a control signal to a pump 8h having a controllable flow rate, as indicated by a dash-dotted line.

The flow rate of the cooling fluid in the cooling duct assembly of FIG. 13 is determined by the flow control device 16h. The cooling fluid supplied by the pump 8h has a predetermined (known) temperature. A signal representative of a temperature measured by the temperature sensor 12 is input to the control system 14h that is configured (e.g. by calibration) to control the flow rate of the cooling fluid by controlling the flow rate of the pump 9h, and possibly also the flow rate of the pump 8h such that a predetermined average temperature Ta of the cooling fluid in the cooling element 2 is reached.

In the embodiment of FIG. 14, a flow control device 16i includes temperature sensors 11 and 12, a control system 14i, and a pump 9i having a controllable flow rate in a recirculation duct 5 connecting the discharge duct 6 to the supply duct 4.

Like in the previous embodiments, the flow rate of the cooling fluid in the cooling duct assembly is determined by the flow control device 16i. Signals representative of temperatures T1 and T2 measured by the temperature sensors 11 and 12, respectively, are input to the control system 14i that compares these temperatures. The control system 14i is configured to control the flow rate of the cooling fluid by the pump 9i, and possibly also the flow rate of the cooling fluid by the pump 8i such that a predetermined average temperature Ta=(T2+T1)/2 of the cooling fluid in the cooling element 2 is reached. Unlike the embodiment of FIG. 13, in the embodiment of FIG. 14 a temperature of the cooling fluid in the supply duct 4, whether upstream or downstream the recirculation duct 5, does not need to be known or set accurately, as long as it is lower than the average temperature Ta to be reached.

FIG. 15 shows a cooling element 2 to be provided in thermal contact with at least part of a motor. A cooling duct assembly includes a supply duct 4 through which a cooling fluid is fed to the cooling element 2, and further includes a discharge duct 6 through which the cooling fluid is discharged from the cooling element 2. A pump 8 provides a flow of the cooling fluid in the cooling duct assembly.

The cooling arrangement shown in FIG. 15 further includes a supplemental duct 15 having an supplemental pump 19, a controllable valve 10 in the supplemental duct 15, a temperature sensor 11 to measure a temperature of the cooling temperature in the supply duct 4 downstream of the supplemental duct 15, and a temperature sensor 12 to measure a discharge temperature of the cooling fluid in the discharge duct 6. The supplemental duct 15 is connected to the supply duct 4, whereby cooling fluid supplied through the supplemental duct 15 is mixed with cooling fluid supplied through the supply duct 4 before flowing to the cooling element 2. Signals representative of the temperatures measured by the temperature sensors 111 and 12 are input to a control system 14j outputting a control signal to control the flow rate of the valve 10. The assembly of the temperature sensors 11 and 12, the control system 14j, and the valve 10 may be considered to be a flow control device 16j.

The operation of the cooling device in FIG. 15 is as follows. The pump 8 delivers a flow of cooling fluid having a first temperature. The pump 19 delivers a flow of cooling fluid having a second temperature, which is higher than the first temperature. The flow of cooling fluid from the pump 19 is controlled by the valve 10, and may be equal to or higher than zero. After mixing the cooling fluid having the first temperature with the cooling fluid having the second temperature, the cooling fluid flows into the supply duct 4, through the cooling element 2, where heat is taken up by the cooling fluid, and further through the discharge duct 6.

The flow rate of the cooling fluid in the cooling duct assembly is determined by the flow control device 16j. Signals representative of temperatures measured by the temperature sensors 11 and 12 are input to the control system 14j that is configured to control the flow rate of the cooling fluid having the second temperature by the valve 10 such that a predetermined average temperature Ta of the cooling fluid in the cooling element 2 is reached.

FIG. 16 shows a flow control device 16k including temperature sensors 11 and 12 inputting temperature signals to a control system 14k, which outputs a control signal to a pump 19k having a controllable flow rate in a supplemental duct 15. Alternatively, or additionally, the control system 14k may output a control signal to a pump 8k having a controllable flow rate, as indicated by a dash-dotted line. As in the embodiment shown in FIG. 15, in the embodiment of FIG. 16 the pump 8k delivers a flow of cooling fluid having a first temperature. The pump 19k delivers a flow of cooling fluid having a second temperature, which is higher than the first temperature. The flow of cooling fluid from the pump 19k may be equal to or higher than zero. After mixing the cooling fluid having the first temperature with the cooling fluid having the second temperature, the cooling fluid flows into the supply duct 4, through the cooling element 2, where heat is taken up by the cooling fluid, and further through the discharge duct 6.

The flow rate of the cooling fluid in the cooling duct assembly of FIG. 16 is determined by the flow control device 16k. Signals representative of temperatures measured by the temperature sensors 11 and 12 are input to the control system 14k that is configured to control the flow rate of the cooling fluid having the second temperature by controlling the flow rate of the pump 19k, and possibly also the flow rate of the pump 8k such that a predetermined average temperature Ta of the cooling fluid in the cooling element 2 is reached.

In relation to the embodiments described using one or more temperature sensors in the cooling duct assembly, alternative embodiments may be envisaged wherein the temperature sensor(s) in the cooling duct assembly are replaced with one or more motor temperature sensors measuring a temperature in at least part of a motor, such as a motor coil, in thermal contact with the cooling element 2. The one or more motor temperature sensors may be present in the motor anyway for safety reasons. In this way, a temperature similar to, or corresponding to the average temperature Ta may be measured and input to a flow control device to control a flow rate of the cooling fluid through at least part of the cooling duct assembly to reach a predetermined average temperature of the cooling fluid in the cooling element 2.

A difference between the embodiments of FIGS. 2-10 on the one hand, and the embodiments of FIGS. 11-16 on the other hand is that in the former embodiments the control may be faster and may be more accurate than in the latter embodiments.

The skilled person will appreciate that various cooling fluid flow rate controls as described above and illustrated in the drawings may be combined with each other to obtain a modified cooling device according to an embodiment of the present invention without departing from the scope of the claims set out below.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The terms "a" or "an", as used herein, are defined as one or more than one. The term plurality, as used herein, is defined as two or more than two. The term another, as used herein, is defined as at least a second or more. The terms including and/or having, as used herein, are defined as including (i.e., open language). The term coupled, as used herein, is defined as connected, although not necessarily directly, and not necessarily mechanically. Further, the terms and phrases used herein are not intended to be limiting; but rather, to provide an understandable description of the invention.

What is claimed is:

1. A cooling device for removing heat from a motor, the cooling device comprising:
   a cooling element provided in thermal contact with at least part of the motor;
   a cooling duct assembly comprising a supply duct configured to supply a cooling fluid to the cooling element, a discharge duct configured to discharge the cooling fluid from the cooling element, and a recirculating duct configured to connect the discharge duct and the supply duct to each other, the recirculation duct having a first pump;
   a second pump configured to cause the cooling fluid to flow through at least part of the cooling duct assembly; and
   a flow control device configured to control a flow rate of the first pump and the second pump, so as to maintain a predetermined average temperature of the cooling fluid in the cooling element.

2. The cooling device of claim 1, wherein the motor is an electric motor to be energized by at least one motor current, the flow control device being configured to measure the at least one motor current to control a flow rate of the cooling fluid.

3. The cooling device of claim 1, wherein the flow control device comprises a valve that is arranged in the cooling duct assembly, the valve being configured to provide a controllable flow rate.

4. The cooling device of claim 3, wherein the valve is in the discharge duct.

5. The cooling device of claim 1, wherein the cooling duct assembly comprises a supplemental duct configured to supply the cooling fluid to the supply duct, the supplemental duct containing an additional pump.

6. The cooling device of claim 5, wherein the flow control device comprises a valve in the supplemental duct, the valve being configured to provide a controllable flow rate.

7. The cooling device of claim 5, wherein the flow control device is configured to control a flow rate generated by the additional pump.

8. The cooling device of claim 1, wherein the flow control device is configured to control a flow rate generated by the pump.

* * * * *